United States Patent
Hamerski et al.

(10) Patent No.: US 6,797,992 B2
(45) Date of Patent: Sep. 28, 2004

(54) APPARATUS AND METHOD FOR FABRICATING A HIGH REVERSE VOLTAGE SEMICONDUCTOR DEVICE

(75) Inventors: Roman J. Hamerski, Olathe, KS (US); Walter R. Buchanan, Olathe, KS (US)

(73) Assignee: FabTech, Inc., Lee's Summit, MO (US)

( * ) Notice: Subject to any disclaimer, the term of this patent is extended or adjusted under 35 U.S.C. 154(b) by 0 days.

(21) Appl. No.: 09/923,647

(22) Filed: Aug. 7, 2001

(65) Prior Publication Data

US 2003/0030069 A1 Feb. 13, 2003

(51) Int. Cl.[7] .................. H01L 29/74; H01L 31/111
(52) U.S. Cl. .................. 257/112; 257/104; 257/105; 257/106; 257/109; 257/910
(58) Field of Search .................. 257/109, 112, 257/104–106, 910

(56) References Cited

U.S. PATENT DOCUMENTS

| | | | | |
|---|---|---|---|---|
| 3,789,503 A | * | 2/1974 | Nishida et al. | 438/237 |
| 4,255,757 A | | 3/1981 | Hikin | |
| 5,141,887 A | * | 8/1992 | Liaw et al. | 438/455 |
| 5,164,813 A | * | 11/1992 | Blackstone et al. | 257/623 |
| 5,275,689 A | | 1/1994 | Felten et al. | |
| 5,294,814 A | * | 3/1994 | Das | 257/77 |
| 5,619,047 A | * | 4/1997 | Bauer | 257/135 |
| 5,631,181 A | * | 5/1997 | Pezzani | 438/106 |
| 5,640,043 A | | 6/1997 | Eng et al. | |
| 5,668,397 A | * | 9/1997 | Davis et al. | 257/520 |
| 5,801,431 A | * | 9/1998 | Ranjan | 257/659 |
| 5,861,657 A | * | 1/1999 | Ranjan | 257/492 |
| 5,895,249 A | * | 4/1999 | Zambrano et al. | 438/356 |
| 5,930,660 A | * | 7/1999 | Davis | 438/549 |
| 6,020,603 A | * | 2/2000 | Tokunoh et al. | 257/171 |
| 6,031,254 A | * | 2/2000 | Quoirin | 257/155 |
| 6,160,288 A | * | 12/2000 | Yamada | 257/330 |
| 2002/0163059 A1 | * | 11/2002 | Hamerski | 257/592 |

* cited by examiner

Primary Examiner—Amir Zarabian
Assistant Examiner—Ida M. Soward
(74) Attorney, Agent, or Firm—Blackwell Sanders Peper Martin LLP

(57) ABSTRACT

The present invention provides a high voltage semiconductor device capable of withstanding excessive breakdown and clamping voltages. The device includes a high resistivity substrate, and an epitaxially grown, low resistivity layer having a stress-relieving dopant. During production, the low conductivity region has one surface that is etched before a high conductivity region is diffused into it or epitaxially deposited on it.

15 Claims, 1 Drawing Sheet

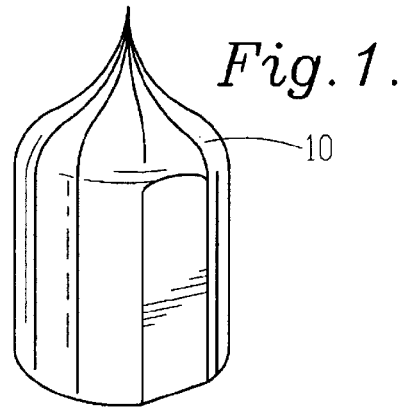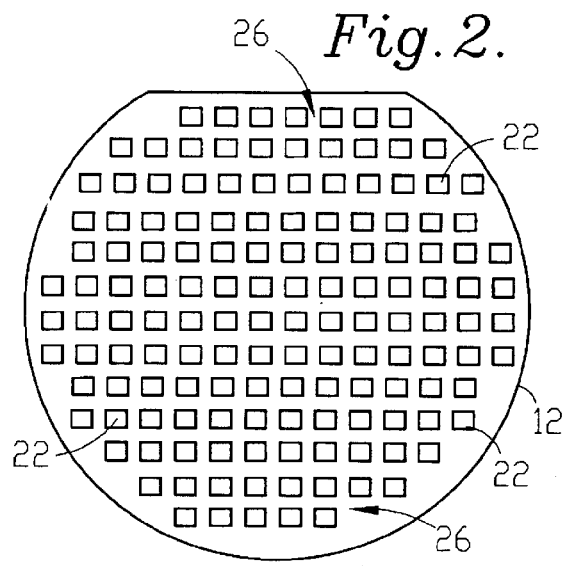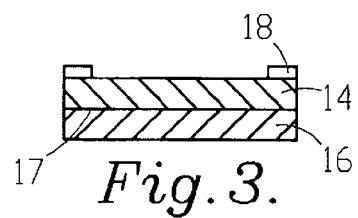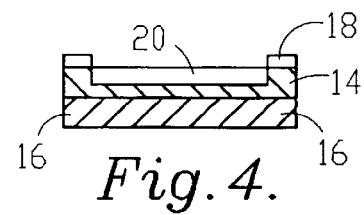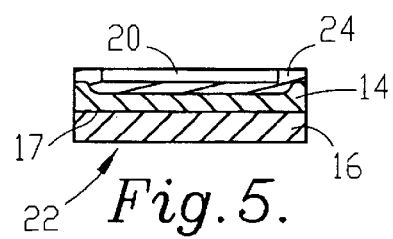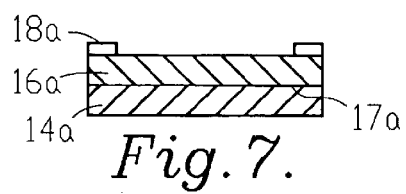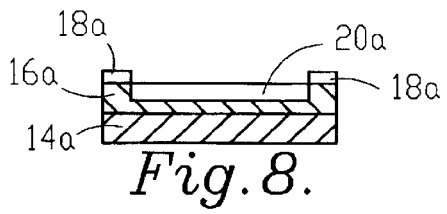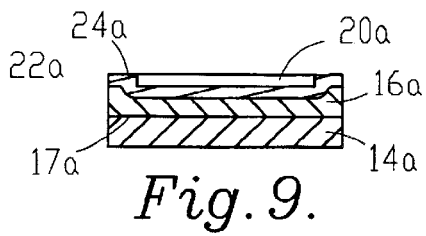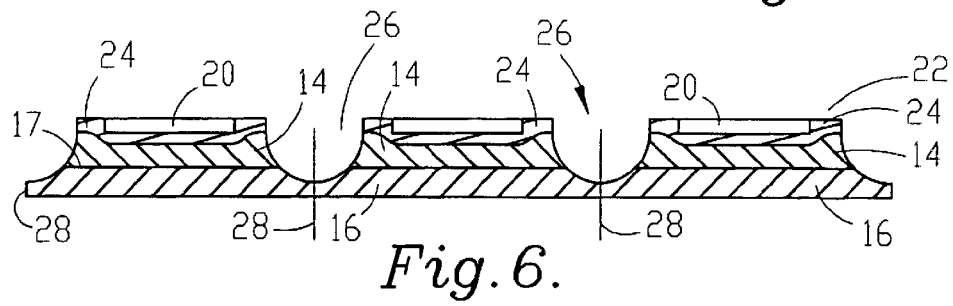

APPARATUS AND METHOD FOR FABRICATING A HIGH REVERSE VOLTAGE SEMICONDUCTOR DEVICE

BACKGROUND OF THE INVENTION

1. Field of the Invention

The present invention relates to electrical semiconductor devices and, more particularly, to high voltage protection diodes having superior resistance to breakdown and superior clamping voltage characteristics when exposed to reverse voltages, and to a method of fabricating such electrical semiconductor devices.

2. Background

High voltage diodes require a high resistivity/low conductivity layer of sufficient thickness and resistivity to effectively block high reverse voltages and reverse currents. Furthermore, the design of such diodes desirably controls and minimizes the electric field at the edges of the diodes.

Prior art attempts at creating high voltage diodes capable of guarding against high reverse voltage or reverse current spikes have met with limited success. With the exception of a few manufacturers using costly processes, high voltage diodes known in the industry are only rated to withstand reverse voltages of 1600V, while sophisticated electronics applications frequently require diodes that can handle reverse voltages in excess of 1700V. Consequently, manufacturers of the more exotic electrical hardware must resort to testing a batch of 1600V diodes and selecting the few which exceed their rating and can meet the electrical parameters demanded by the hardware. Naturally, this leads to manufacturing delays and increased expense.

Typically, these diodes are formed by epitaxially growing a low conductivity layer onto a high conductivity substrate. Thereafter, a silicon oxide, ($SiO_2$) mask is created by covering the exposed surface of the epitaxial layer with $SiO_2$ and etching the $SiO_2$ layer to expose a predetermined portion of the epitaxial surface. The portion to be exposed is predetermined in that the pattern is selected prior to beginning production of the device. A high conductivity layer is then diffused into the epitaxial layer creating deeper diffused regions where the $SiO_2$ has been etched away and shallower diffused regions where the $SiO_2$ remains. This results in a device with improved control of and which minimizes the electric field at the device edges. However, this known process for creating a dopant high conductivity layer involving applying and etching an $SiO_2$ layer to create a mask through which the dopant high conductivity layer is diffused into the low conductivity layer is time consuming, expensive, and somewhat inexact.

Generally, the quality of the high voltage diode is proportional to the degree to which the low conductivity layer is free of contamination and defects. The extent to which an epitaxially-grown layer is free of defects is related to the rate at which it is grown. Generally, the slower the rate of epitaxial growth, the fewer the number of defects that are introduced into epitaxial layer.

In practice, the growth rate necessary to create an epitaxial layer sufficiently defect-free to function effectively as a low conductivity layer is three times the epitaxial growth rate necessary for the epitaxial layer to function effectively as a high conductivity layer. The increase in the time necessary to grow a low conductivity epitaxial layer translates into a production expense that significantly increases cost.

Alternatively, directly etched, entirely diffused semiconductor structures known in the art avoid the aforementioned problems. These devices are created by directly etching one surface of a low conductivity substrate and diffusing a high conductivity dopant layer therein, and diffusing an oppositely charged, high conductivity layer into the opposing substrate surface to create a P/N junction. However, the optimum depth of the diffused layers is too thin to structurally maintain a wafer intact when moats are etched in one surface of the wafer, as is necessary to create multiple devices on a single wafer. Increasing the depth of a diffused layer in an attempt to improve structural strength sufficiently to prevent a multiple-device wafer from crumbling during moat etch can cause the wafer to warp, making it more difficult to process, and leading to an unacceptably high rate of waste from breakage. Further, the boundary between the layers of a diffused P/N junction is more graded than the boundary between the layers of an epitaxially-grown P/N junction, resulting in an increased forward voltage drop across the device. Typically, the forward voltage drop across a diffused structure can be as high as 5V, while that of an epitaxial structure is as low as 1.7V for fast switching devices. Consequently, entirely diffused devices yield less attractive physical and electrical parameters.

SUMMARY OF THE INVENTION

The device of the present invention includes an electrical semiconductor appliance having a substrate of doped material on which a layer of oppositely doped material is epitaxially grown to form a P/N junction. The defects typically encountered during rapid epitaxial growth do not adversely affect the electrical performance of a semiconductor device when the defects are confined to a high conductivity region of the device. Therefore, in a preferred embodiment, the epitaxial layer is positioned to function as the high conductivity region of the P/N junction, resulting in an epitaxial layer that can be grown three times more rapidly than when it is positioned to function as the low conductivity region of the P/N junction.

In another aspect of the invention and irrespective of whether the epitaxial layer is positioned to function as the high conductivity region, the exposed surface of the low conductivity layer of the P/N junction is directly masked and etched via a photo-resist process. A high conductivity layer is then diffused into the etched surface of the low conductivity layer.

The time delay and expense of applying an $SiO_2$ layer, the expense and waste incurred by etching a mask through the $SiO_2$ layer and, ultimately, by removing the $SiO_2$ mask, and the resultant diffusion depths that are inexact and inconsistent due to the unavoidably irregular thicknesses of the $SiO_2$ layer are thereby avoided.

Also irrespective of whether the epitaxial layer functions as the high conductivity region, in a preferred embodiment germanium is permeated throughout the epitaxial layer during formation of the P/N junction, i.e., during the growth stage of the epitaxial layer, to serve as a stress-relieving dopant to counter the stress caused by the lattice mismatch between a lightly doped silicon and heavily boron doped silicon. As a result, warpage is reduced and breakage of wafers containing a plurality of the devices of the present invention is minimized, and it becomes economically feasible to produce wafers of increased diameter.

It is therefore an object of the present invention to provide improved high voltage electrical semiconductor devices achieved by providing reduced electrical field strengths at their perimeters.

BRIEF DESCRIPTION OF THE DRAWINGS

In the drawings that illustrate the preferred embodiment of the invention:

FIG. 1 is a perspective view of a monocrystaline semiconductor ingot;

FIG. 2 is a schematic top plan view of a wafer having a plurality of electrical devices formed therein;

FIG. 3 is a schematic cross-sectional view of a portion of a wafer having an etching mask applied to one surface;

FIG. 4 is a view similar to FIG. 3 showing the wafer after it has been etched;

FIG. 5 is a view similar to FIG. 4 showing the wafer after the mask has been removed and after the wafer has undergone diffusion or epitaxial deposition;

FIG. 6 is a schematic cross-sectional view of a portion of a wafer having moats formed between a plurality of electrical devices formed therein;

FIG. 7 is an alternative embodiment to the device shown in FIG. 3;

FIG. 8 is an alternative embodiment to the device shown in FIG. 4; and

FIG. 9 is an alternative embodiment to the device shown in FIG. 5.

DETAILED DESCRIPTION OF THE INVENTION

Referring to the figures in greater detail, FIG. 1 shows an ingot 10 comprising a high purity, monocrystaline semiconductor material formed by monocrystaline growth methods known in the industry. Alternatively, the high quality semiconductor ingot 10 can also be fabricated using the float zone method, also known in the industry. Lateral sections of predetermined thickness are sliced from the ingot 10 to form a wafer 12 shown in FIG. 2. The thickness is predetermined in that it is selected prior to slicing. The slicing thickness of the wafer is approximately 525 microns for 100 mm diameter wafers. The preferred wafer thickness for present applications yields, after further processing described below, a substrate layer 14 (FIG. 3) with a thickness that ranges from approximately 50 microns to approximately 200 microns. Devices with substrates in this thickness range yield devices that can withstand reverse voltages from 1000V to 3000V.

In a preferred embodiment, the ingot 10 and thus the substrate layer 14 are composed of low conductivity material having an N type dopant. The specific resistance of the substrate layer 14 is preferably in the range of approximately 25 ohmcm to approximately 400 ohmcm, with the preferred value being approximately 60 ohmcm.

As can be seen in FIGS. 3–6, an epitaxial layer 16 composed of high conductivity material having an opposite dopant to that of the substrate layer 14, is grown adjacent to one surface of the substrate layer 14, forming a P/N junction 17. Because defects in the crystal structure are less of a concern when the epitaxial layer 16 forms a high conductivity region, the epitaxial growth rate can be increased over the rate necessary to maintain a low defect crystal, yielding a more economical production process. Preferably, the low resistivity epitaxial layer 16 is deposited onto the substrate layer 14 at a deposition rate of between approximately 2 microns/minute and approximately 3 microns/minute.

In a preferred embodiment, the epitaxial material 16 has a P type dopant. The thickness of the epitaxial layer 16 is preferably between approximately 200 microns and approximately 400 microns.

Also in a preferred embodiment, germanium is permeated throughout the epitaxial region 16 in a predetermined amount, as the epitaxial region 16 is grown, to reduce the stress forces caused by the lattice mismatch between a lightly doped silicon and heavily boron doped silicon. The amount of germanium is predetermined in that it is selected prior to permeating it throughout the epitaxial region 16. The germanium concentration is preferably in the range of from approximately $2 \times 10^{19}$ atoms/cm$^3$ to approximately $5 \times 10^{19}$ atoms/cm$^3$. The germanium concentration can be as much as approximately 150% of the P-type or N-type dopant concentration.

In a preferred embodiment of another aspect of the invention, a photo-resist mask 18, shown in FIGS. 3 and 4, is removably applied to the opposing surface of the substrate layer 14.

Exposed portions of the opposing surface of the substrate 14 are then directly etched to a predetermined depth. This forms a central cavity or well 20 in each exposed portion, and each well 20 corresponds to an individual semiconductor device 22. The depth is predetermined in that it is selected prior to etching. Upon removal of the mask 18, a high conductivity dopant region/layer 24, shown in FIG. 5, is diffused into the opposing layer of the substrate 14. In a preferred embodiment, the dopant region has an N type dopant. Though the particular dopants used to achieve the conducting layers and regions of the present invention will not be described particularly, it should be understood that boron can be used as a P-type dopant while phosphorous, arsenic, and antimony can be used as N-type dopants for silicon. Similarly, the semiconductor material can be silicon, germanium, or any compound semiconductor material such as gallium arsenide with appropriate changes to the dopant material depending on the semiconductor material selected.

Alternatively, the dopant region 24 can be epitaxially deposited onto the etched surface of the substrate 14, so that the dopant region is essentially a layer. However, it is intended that the terms region and layer be used interchangeably and to refer to either a diffused area or a deposited area. In a further alternative, the dopant region 24 can be diffused through an SiO$_2$ mask into the surface of an unetched substrate 14. In this method, a layer of SiO$_2$ is applied to the substrate layer and the SiO$_2$ layer is then masked and etched to form an SiO$_2$ mask through which the dopant is diffused. Thus, the substantially centrally located well 20 formed in the region or such that the distance between the region and the second layer is reduced at the location of the well 20.

Thereafter, a grid of moats 26, shown in FIGS. 2 and 6, is formed through the dopant layer 24 and the substrate layer 14, extending into a portion of the epitaxial layer 16 in a predetermined configuration to define the perimeters of individual devices 22 with positive bevel angles. The configuration is predetermined in that it is selected prior to creation of the grid of moats 26. The termination angle of the bevel angle is preferably greater than approximately 15° and, more preferably, the angle is approximately 57°.

The devices 22 are ultimately separated from each other along cut lines 28 and packaged in a conventional manner. The high voltage devices 22 are generally intended for low current use, i.e., for between approximately 1 amp and approximately 100 amps, with a preferred range of between approximately 1 amp and 20 amps. A preferred device 22 is rated to operate at approximately 7 amps in the forward direction, while being able to withstand reverse voltages of approximately 1750V. The sides of each device 22 are approximately 2500 microns in length, thereby permitting approximately 1000 devices 22 to be manufactured on a single wafer 12 having a diameter of approximately 100 mm.

An alternative embodiment shown in FIGS. 7 through 9 includes a substrate 14a composed of a heavily doped, high conductivity material. An epitaxial layer 16a of low conductivity material having an opposite dopant to that of the substrate 14a is grown with one surface adjacent one surface of the substrate 14a, forming a P/N junction 17a.

In a preferred embodiment, a photo-resist mask 18a is removably applied to the opposing surface of the epitaxial layer 16a. Exposed portions of the opposing surface of the epitaxial layer 16a are then directly etched to a predetermined depth, forming a central cavity or well 20a in each exposed portion, each well 20a corresponding to an individual semiconductor device 22a. Upon removal of the mask 18a, a high conductivity dopant region 24a is diffused into the opposing surface of the epitaxial layer 16a. Alternatively, the dopant region/layer 24 can be epitaxially deposited onto the etched surface of the substrate 14. Due to the weaker electrical fields associated with the edge terminations, the likelihood of snapback occurring in a diode or other electrical device according to the present invention is lower.

After the etching step, the wafer 12 will be separated along the lines of separation 28. However, both before and after separation, the wafer 12 and the individual devices 22 are further processed to form a plurality of desired semiconductor devices, preferably diodes according to the described method. For example, any photoresist material left after etching will be removed.

It is recognized and anticipated that the devices may be any electrical device having semiconductor characteristics used in the art, such as transistors, light emitting diodes, and others, and accordingly, it is intended that the claims shall cover all such electrical devices that do not depart from the spirit and scope of the present invention. The electrical devices may then be completed and packaged or implemented in an electrical circuit by any conventional method or process known in the art. For example, after the moats are etched, the devices are passivated and then separated from each other. Additionally, switching speed is controlled by a high temperature diffusion step, which may be performed before the devices are separated from each other.

Thus, there has been shown and described multiple embodiments of an electrical semiconductor device and method for fabrication of same that fulfill all of the objects and advantages sought therefor. Many changes, modifications, variations and other uses and applications of the present device will, however, become apparent to those skilled in the art after considering this specification and the accompanying drawings. All such changes, modifications, variations and other uses and applications which do not depart from the spirit and scope of the invention are deemed to be covered by the invention which is limited only by the claims which follow.

What is claimed is:

1. An electrical semiconductor device comprising:
    a high resistivity layer of one conductivity type and having opposing first and second surfaces;
    a layer of relatively low resistivity material of a conductivity type opposite to the one conductivity type and having a surface substantially contiguous to the first surface of the high resistivity layer;
    a dopant region of relatively low resistivity material of the one conductivity type having a surface substantially contiguous to the second surface of the high resistivity layer;
    a substantially centrally defined well in said high resistivity layer, said well reducing the thickness in a portion of the high resistivity layer, thus reducing an electric field in said portion of the semiconductor device; and
    an edge termination defined in part by a moat.

2. The device of claim 1 wherein the second surface is etched, and the dopant region is diffused into the second surface of the high resistivity layer.

3. The device of claim 1 wherein the second surface well is etched, and the dopant region is epitaxially gown onto the second surface of the high resistivity layer.

4. The device of claim 1 wherein a silicon oxide mask is applied to the first surface of the layer of relatively low resistivity and the dopant region is diffused through the silicon oxide mask and into the second surface of the layer of relatively low resistivity.

5. The device of claim 1 wherein the high resistivity layer includes a stress-relieving dopant.

6. The device of claim 5 wherein the stress-relieving dopant is germanium.

7. An electrical semiconductor device comprising:
    a high resistivity layer of one conductivity type and having opposing first and second surfaces, the high resistivity layer further having a dopant material permeated throughout the layer;
    a layer of relatively low resistivity material of a conductivity type opposite to the one conductivity type and having a surface substantially contiguous to the first surface of the high resistivity layer; and
    a region of relatively low resistivity material of the one conductivity type having a surface substantially contiguous to the second surface of the high resistivity layer;
    wherein the second surface of the high resistivity layer has a substantially centrally located well that reduces the thickness in a portion of the high resistivity layer, thus reducing an electric field in said portion of the electrical semiconductor device and wherein the electrical semiconductor device has an edge termination defined in part by a moat.

8. The device of claim 7 wherein the region contains a stress-relieving dopant.

9. The device of claim 8 wherein the stress-relieving dopant is germanium.

10. The device of claim 7 wherein a silicon oxide mask is applied to the second surface of the high resistivity layer and the region is diffused through the silicon oxide mask and into the second surface of the high resistivity layer.

11. An electrical semiconductor device comprising:
    a first layer of relatively high resistivity material of one conductivity type having opposing first and second surfaces;
    a second layer of relatively low resistivity material of a conductivity type opposite to the one conductivity type and having one surface substantially contiguous to the first surface of the substrate;
    a region of relatively low resistivity material of the one conductivity type and having one surface substantially contiguous to the second surface of the substrate; and
    a substantially centrally located well formed in the first layer such that the distance between the region and the second layer is reduced at the location of the well, said well able to receive a conductive layer; and
    an edge termination defined in part by a moat.

12. The device of claim 10 wherein the second surface of the high resistivity layer receives a lesser amount of diffused material to form said to reduce said resulting electric field.

13. The device of claim 1, wherein said well has a diffused dopant region.

14. The device of claim 1, said well receives a conductive layer.

15. The device of claim 1, wherein said well is bounded by a bottom surface and a side surface, the side surface defining a depth distance between said first surface and said bottom surface and wherein said distance between said second surface and said bottom surface is less than the distance between said first surface and said second surface.

* * * * *